US010615086B2

(12) United States Patent
Sarafianos et al.

(10) Patent No.: US 10,615,086 B2
(45) Date of Patent: Apr. 7, 2020

(54) METHOD OF DETECTING A POSSIBLE THINNING OF A SUBSTRATE OF AN INTEGRATED CIRCUIT VIA THE REAR FACE THEREOF, AND ASSOCIATED DEVICE

(71) Applicant: STMicroelectronics (Rousset) SAS, Rousset (FR)

(72) Inventors: Alexandre Sarafianos, Pourrieres (FR); Abderrezak Marzaki, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/209,044

(22) Filed: Dec. 4, 2018

(65) Prior Publication Data

US 2019/0172759 A1 Jun. 6, 2019

(30) Foreign Application Priority Data

Dec. 5, 2017 (FR) ...................... 17 61625

(51) Int. Cl.
*H01L 21/66* (2006.01)
*H01L 23/00* (2006.01)
*H03K 19/00* (2006.01)
*H01L 29/00* (2006.01)

(52) U.S. Cl.
CPC ............. *H01L 22/12* (2013.01); *H01L 22/34* (2013.01); *H01L 23/576* (2013.01); *H01L 29/00* (2013.01); *H03K 19/00* (2013.01)

(58) Field of Classification Search
CPC ....................................................... H01L 21/66
See application file for complete search history.

(56) References Cited

U.S. PATENT DOCUMENTS

2013/0193437 A1 8/2013 Lisart et al.
2015/0214163 A1 7/2015 Kuenemund et al.

FOREIGN PATENT DOCUMENTS

EP 1691413 A1 8/2006
FR 2981783 A1 4/2013

OTHER PUBLICATIONS

INPI Search Report and Written Opinion for FR 1761625 dated Aug. 22, 2018 (8 pages).

*Primary Examiner* — Marvin Payen
(74) *Attorney, Agent, or Firm* — Crowe & Dunlevy

(57) ABSTRACT

A semiconductor substrate includes a buried semiconductor layer and semiconductor wells. A device for detecting a possible thinning of the semiconductor substrate via the rear face thereof is formed on and in the semiconductor wells. The device is a non-inverting buffer including an input terminal and an output terminal, the device being powered between a supply terminal and a reference terminal where the buried semiconductor layer provides the supply terminal. A control circuit delivers an input signal in a first state to the input terminal and outputs a control signal indicating a detection of a thinning of the substrate if a signal generated at the output terminal in response to the input signal is in a second state different from the first state.

13 Claims, 5 Drawing Sheets

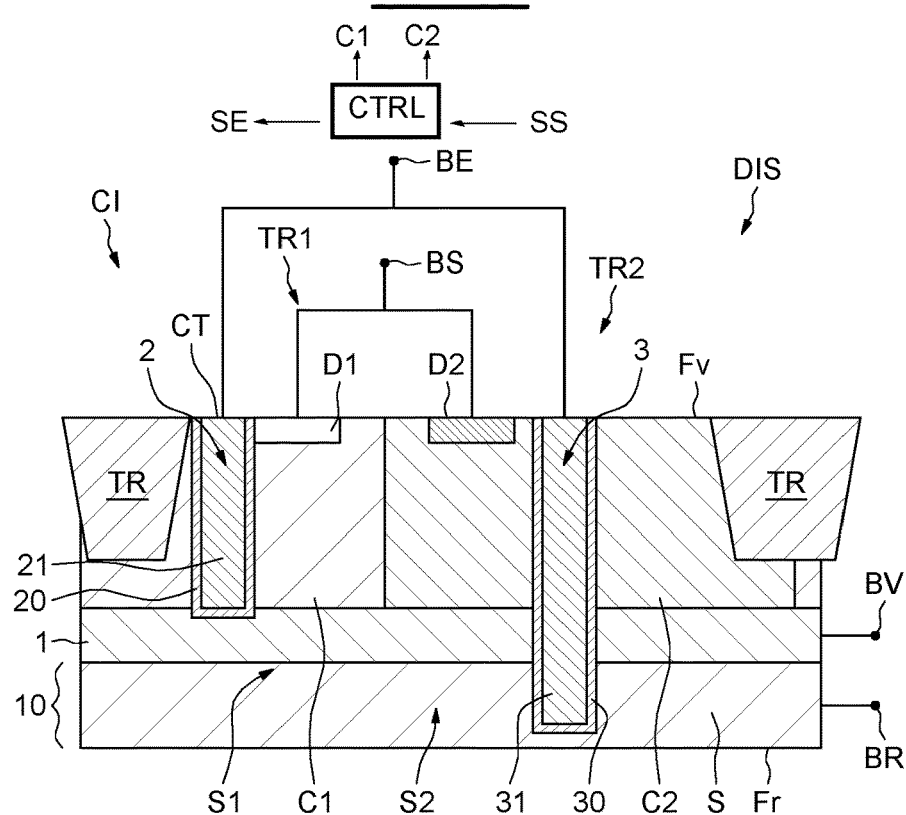
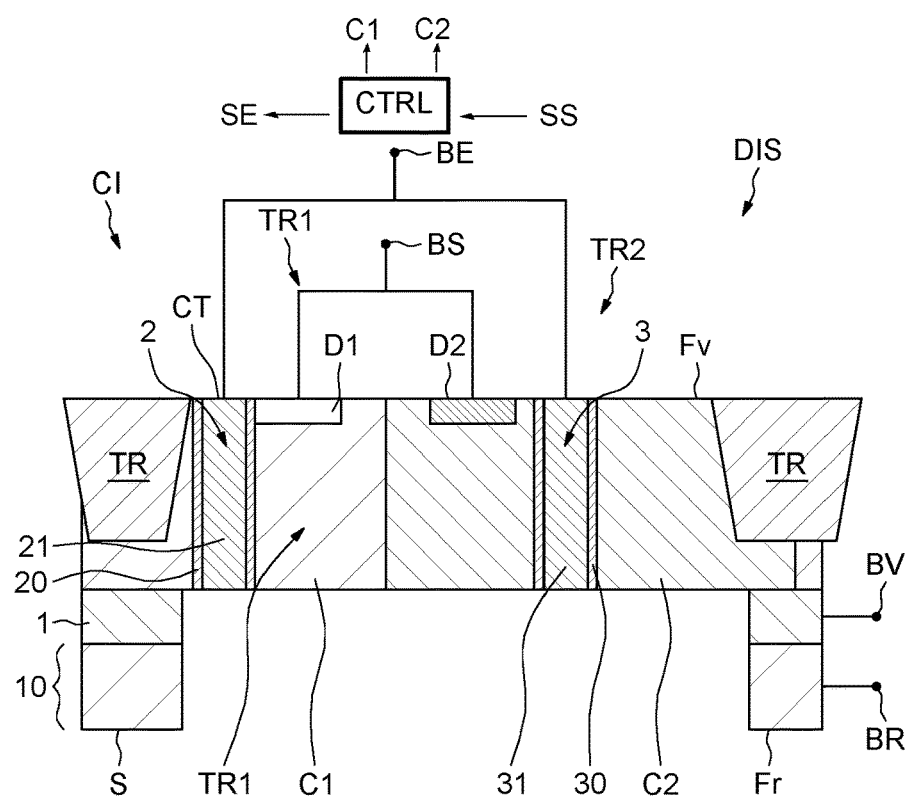

METHOD OF DETECTING A POSSIBLE THINNING OF A SUBSTRATE OF AN INTEGRATED CIRCUIT VIA THE REAR FACE THEREOF, AND ASSOCIATED DEVICE

PRIORITY CLAIM

This application claims the priority benefit of French Application for Patent No. 1761625, filed on Dec. 5, 2017, the content of which is hereby incorporated by reference in its entirety to the maximum extent allowable by law.

TECHNICAL FIELD

Modes of implementation and embodiments relate to integrated circuits, and more particularly the detection of a possible thinning of the substrate of an integrated circuit from the rear face thereof.

BACKGROUND

Integrated circuits, in particular those provided with memories containing sensitive information, must be, as much as possible, protected against attacks, in particular those intended to uncover stored data.

A possible attack can be carried out via the rear face of an integrated circuit, using a laser beam.

The effectiveness of such an attack increases when the substrate of the integrated circuit is thinned by the attacker from the rear face thereof such as to get as close as possible to the components of the integrated circuit, which are produced at the front face thereof. The thinning of the rear face of the integrated circuit can occur, for example, using a focused ion beam (FIB) and/or using a polishing/abrasion step.

Means exist which make it possible to detect a thinning of the substrate via the rear face thereof. However, these means sometimes have a low level of integration, and sometimes can disrupt the operation of the components located close by.

These existing means can, for example, use a resistance that varies with the thinning of the substrate. However, this type of solution can be a source of errors, particularly for integrated circuits having a variable temperature, which varies the value of the resistance even when there is no thinning.

Furthermore, it is possible for the existing devices to be modified by an attacker prior to the detection, such as to falsify the result thereof, for example by forcing an output signal to a state indicating an absence of detection.

Thus, according to an embodiment, a method and a device are proposed which make it possible to reliably detect a thinning of the substrate via the rear face thereof, the device having a reduced spatial requirement.

SUMMARY

According to one aspect, an integrated circuit is proposed which includes a semiconductor substrate, produced above a buried semiconductor layer and including a supply terminal configured to receive a supply voltage and a reference terminal configured to receive a reference voltage, and at least one device for detecting a possible thinning of the substrate via the rear face thereof including: a non-inverting buffer including a first MOS transistor and a second MOS transistor that are complementary and coupled in series between the supply terminal and the reference terminal, an input terminal and an output terminal comprising the electrode common to both transistors, the buried semiconductor layer including the supply terminal, a control circuit configured to generate an input signal in a first state, the non-inverting buffer being suitable, in the presence of the input signal in the first state and in the absence of thinning of the substrate, to move into a first configuration in which the first transistor is configured to authorize the delivery on the output terminal of an output signal having the first state and in which the second transistor is switched off and, the control circuit being furthermore configured to generate a control signal corresponding to a thinning of the substrate if the signal on the output terminal is in a different state to the first state.

In the case of thinning of the substrate, the semiconductor layer including the supply terminal is damaged and the non-inverting buffer is no longer powered by the supply voltage.

During the transmission of a high state on the input terminal thereof, it can no longer transmit a high state on the output terminal thereof since this high state corresponds conventionally to an electric coupling of the output terminal to the supply terminal.

The use of a non-inverting buffer makes it possible to have a detection device comprising simple means and having a reduced spatial requirement.

According to an embodiment, the control circuit can be configured to deliver the input signal in a second state, the non-inverting buffer then being suitable, in the presence of the input signal in the second state thereof, to move into a second configuration of the device, in which configuration the first transistor authorizes the delivery on the output terminal of a signal having the second state, and for generating a second control signal if the signal delivered by the output terminal is in the first state.

Thus, the device can be configured to verify the correct transmission of a low state by the non-inverting buffer.

Indeed, an attacker who would like to bypass the detection device could deliver a signal having a high state to the output terminal, such that the device in the first configuration thereof is not suitable for detecting a thinning of the substrate via the rear face thereof.

The second configuration therefore makes it possible to ensure that the detection of a possible thinning of the substrate in the first configuration is reliable.

The first MOS transistor includes an electrode semiconductor first region located at a front face of the substrate and coupled to the output terminal, an insulated vertical gate region extending between the electrode semiconductor first region and the buried semiconductor layer including an electrode semiconductor second region of the vertical transistor, and a second MOS transistor coupled between the output terminal and the reference terminal, the control circuit being configured to switch off the first transistor and to couple the output terminal to be reference terminal via the second transistor in the second configuration, and to couple the output terminal to the supply terminal via the first transistor and to switch off the second transistor in the first configuration.

The use of a vertical transistor advantageously makes it possible to simply couple the non-inverting buffer to the buried semiconductor layer.

The device can comprise a first semiconductor well of a first conductivity type, a second semiconductor well of a second conductivity type, the first transistor being of the second conductivity type and produced in the first well, the second transistor being of the first conductivity type and produced in the second well.

According to an embodiment, the second MOS transistor can be a horizontal transistor, an electrode semiconductor first region and an electrode semiconductor second region of which are produced at the front face of the substrate.

The use of a second horizontal transistor makes it possible to produce the device using simple means.

According to an embodiment, the substrate is coupled to the reference terminal, the second MOS transistor being a vertical transistor, the gate of which includes a second insulated vertical electrode extending from the front face of the substrate into the second well such as to pass through the buried semiconductor layer, the substrate including an electrode semiconductor region of the second MOS transistor.

The use of a second vertical transistor advantageously makes it possible to obtain a detection device having a small surface spatial requirement.

The integrated circuit can include a plurality of detection devices as described above, which are coupled in series between an input terminal common to all of the devices and an output terminal common to all of the devices.

According to one aspect, a system is proposed which comprises an integrated circuit as described above, wherein the system can be a chip card.

According to another aspect, a method for detecting a possible thinning of a semiconductor substrate of an integrated circuit via the rear face thereof is proposed, the integrated circuit being produced above a buried semiconductor layer and including a supply terminal configured to receive a supply voltage and a reference terminal configured to receive a reference voltage, wherein: a non-inverting buffer is produced, which includes an input terminal and an output terminal, a first MOS transistor and a second MOS transistor which are complementary and coupled in series between the supply terminal and the reference terminal (BR), the buried semiconductor layer including the supply terminal, an input signal in a first state is generated, the non-inverting buffer being suitable, in the presence of the input signal in the first state and in the absence of thinning of the substrate, to move into a first configuration in which the first transistor is configured to authorize the delivery on the output terminal of a signal having the first state and in which the second transistor is switched off, and a control signal is generated, which corresponds to a detection of a thinning of the substrate if the signal delivered by the output terminal is in a different state to the first state.

According to a mode of implementation, the input signal in a second state is delivered, the non-inverting buffer then being suitable, in the presence of the input signal in the second state thereof, to move into a second configuration in which the first transistor authorizes the delivery on the output terminal of a signal having the second state, and a second control signal is generated if the signal delivered by the output terminal is in the first state.

BRIEF DESCRIPTION OF THE DRAWINGS

For a better understanding of the embodiments, reference will now be made by way of example only to the accompanying figures in which:

FIG. 5 illustrates an embodiment in which the second MOS transistor is a vertical transistor;
FIG. 6 illustrates thinning of the substrate.

DETAILED DESCRIPTION

Figure 1:
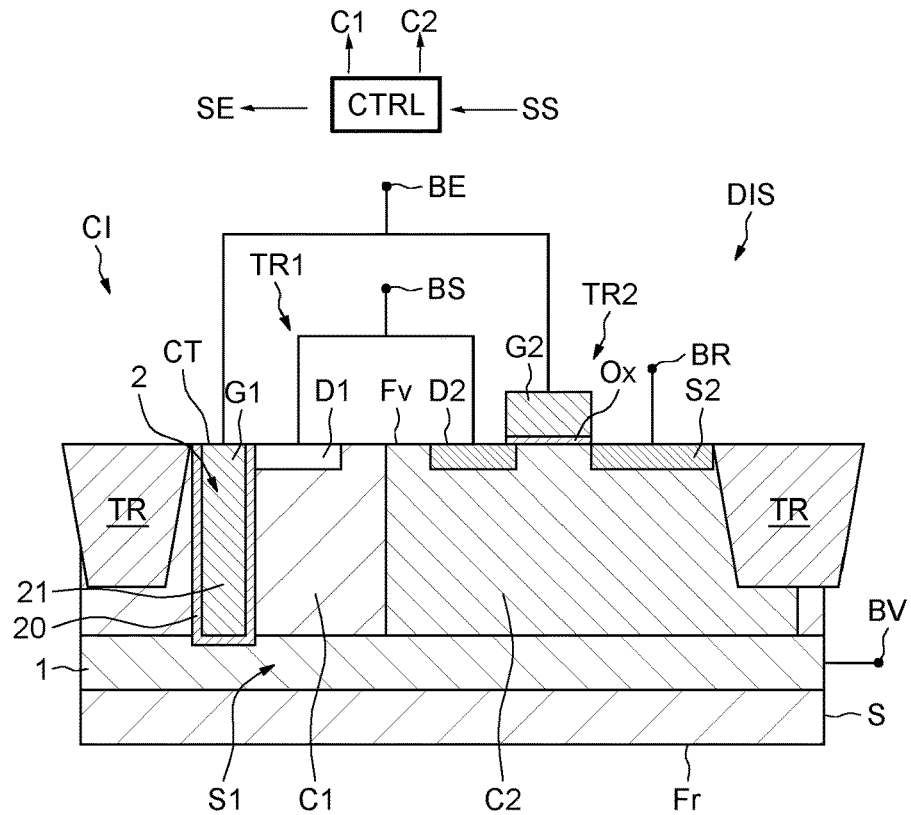
FIG. 1 is a sectional view of an integrated circuit.
Figure 2:
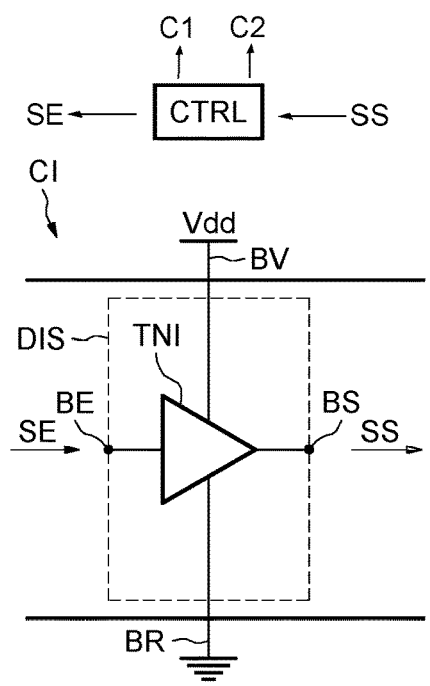
FIG. 2-3 show schematic circuit diagrams.
Figure 3:
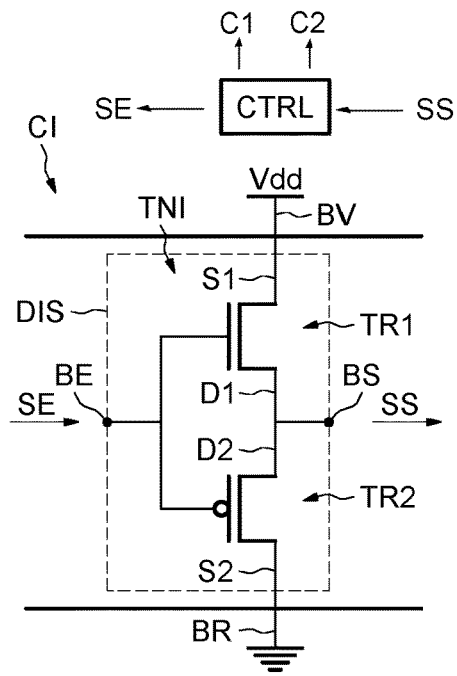

FIG. 1 is a sectional view of an integrated circuit CI, for which FIGS. 2 and 3 are schematic representations from an electrical point of view, with two different levels of detail.

The integrated circuit CI is produced in and on a semiconductor substrate S of a first conductivity type, for example in this case a P-type conductivity.

The substrate includes, for example, a plurality of semiconductor wells, at least some of which (not shown) comprise components, for example transistors, which can form storage cells, encryption circuits, or any other electronic module.

In order to protect the data stored in the storage cells, the integrated circuit CI comprises several devices for detecting a thinning of the substrate via the rear face Fr thereof, a single device DIS of which is shown in FIG. 1 for the purposes of simplicity.

The device DIS includes an input terminal BE, configured to receive an input signal SE which can be in a first state, for example in this case a low state, or in a second state, for example in this case a high state, and an output terminal BS, configured to deliver an output signal SS which can be in the first state or in the second state.

The device DIS in this case includes a non-inverting buffer TNI, the input of which is coupled to the input terminal BE, the output is coupled to the output terminal BS, and which is powered between a supply terminal BV intended to receive a supply voltage Vdd, and a reference terminal BR configured to receive a reference voltage, for example in this case ground.

The non-inverting buffer TNI is coupled to control circuit CTRL, which is configured to deliver the input signal SE on the input terminal BE and to read the output signal SS.

In a first configuration of the non-inverting buffer TNI, the device DIS is configured to carry out a detection of a possible thinning of the substrate via the rear face Fr thereof, the detection comprising the verification of the correct transmission of a high state by the non-inverting buffer TNI as will be seen hereafter.

In this first configuration, the control circuit CTRL is configured to generate a first control signal C1 if a thinning is detected, and the integrated circuit is configured to stop or reset upon receiving this first control signal.

In a second configuration of the non-inverting buffer TNI, the device DIS is configured to verify that the output signal SS delivered by the output terminal BS has not been forced to a state indicating an absence of thinning of the substrate S, the detection comprising the verification of the correct transmission of a low state by the non-inverting buffer TNI as will be seen hereafter.

Indeed, it will be possible for an attacker, prior to the device DIS starting, to force the output of the device such that the device DIS in the first configuration thereof is not able to detect a thinning of the substrate S.

In this second configuration, the control circuit CTRL is configured to generate a second control signal C2 if the signal delivered by the output terminal has been forced, and the integrated circuit CI is configured to stop or to reset upon receiving this second control signal.

The non-inverting buffer TNI can be in a third configuration corresponding to a deactivation of the device DIS.

The device DIS is separated from the rest of the integrated circuit CI by an isolation trench TR, for example in this case a shallow-type trench (STI, "Shallow Trench Isolation" well known to a person skilled in the art) and from the rest of the substrate S by a buried semiconductor layer 1 of a second conductivity type opposed to the first conductivity type, which layer is produced under the device DIS.

This buried layer 1 is commonly referred to by a person skilled in the art as a "NISO layer" for n-type isolation, and is coupled to the supply terminal BV.

An integrated circuit architecture including such a buried layer is known to a person skilled in the art as "triple well architecture".

The device DIS includes a first semiconductor well C1, of the first conductivity type, and a second semiconductor well C2, of the second conductivity type, in this case an N-type conductivity, which are produced in a juxtaposed manner in contact with each other.

The first well C1 includes a first vertical MOS transistor TR1 of the second conductivity type (vertical here indicating that the current flows through the channel in a vertical direction perpendicular to the surface Fv), which is coupled between the supply terminal BV and the output terminal BS, and the second well C2 includes a second transistor TR2 of the first conductivity type, in this case a horizontal transistor (horizontal here indicating that the current flows through the channel in a horizontal direction parallel to the surface Fv), coupled between the output terminal BS and the reference terminal BR.

The gates of the two transistors TR1 and TR2 are coupled to the input terminal BE, and the two transistors connected in this manner form the non-inverting buffer TNI.

The first well C1 includes a first insulated vertical electrode 2, produced in the first semiconductor well C1, such as to extend from the front face Fv of the substrate as far as the buried semiconductor layer 1.

The first insulated vertical electrode 2 comprises a trench including an insulating wall 20, for example in this case silicon dioxide, and filled with a conductive material 21, for example in this case polysilicon.

The insulated vertical electrode 2 in this case includes the gate region G1 of the first transistor TR1.

An electrode semiconductor first region of the first transistor TR1, in this case the drain D1, is produced at the front face of the substrate S, and includes a portion of the first well C1, doped with the second conductivity type.

The drain D1 of the first transistor TR1 is in this case coupled to the output terminal BS.

The buried semiconductor layer 1 includes an electrode semiconductor second region of the first transistor TR1, in this case the source S1 which is therefore coupled to the supply terminal BV.

The second transistor TR2 in this case includes a gate region G2, conventionally produced on a thin layer of gate oxide Ox, itself produced at the front face of the second well C2.

The second transistor TR2 includes an electrode semiconductor first region, in this case the source S2, and an electrode semiconductor second region, in this case the drain D2, which are produced on either side of the gate region by localized doping of the second well C2 at the front face Fv.

The source S2 of the second transistor TR2 is in this case coupled to the reference terminal BR, and the drain D2 is in this case coupled to the output terminal BS.

The first transistor TR1 is therefore an NMOS transistor, and the second transistor TR2 is therefore a PMOS transistor.

When the input signal SE is in a high state, i.e. in this case when the gates of the two transistors receive a high state, conventionally the supply voltage, the gate-to-source voltage of the NMOS transistor is zero, and the gate-to-source voltage of the PMOS transistor is positive and approximately equal to the supply voltage.

Thus, none of the transistors TR1 and TR2 has the gate-to-source voltage thereof exceeding the threshold voltage.

However, due to the zero gate-to-source voltage thereof, the first NMOS transistor TR1 conducts leakage currents between the source thereof and the drain thereof.

Thus, the output terminal is coupled to the supply terminal by means of the first NMOS transistor TR1, in particular thanks to the leakage currents of the first NMOS transistor TR1.

The second PMOS transistor TR2, the gate of which is positively biased, does not conduct any leakage current.

When the input signal SE is in a low state, i.e. in this case when the gates of the two transistors TR1 and TR2 receive a low state, conventionally the reference voltage, in this case ground, the gate-to-source voltage of the first NMOS transistor TR1 is negative, and the gate-to-source voltage of the second PMOS transistor TR2 is zero.

Thus, none of the transistors TR1 and TR2 has the gate-to-source voltage thereof exceeding the threshold voltage thereof.

However, due to the zero gate-to-source voltage thereof, the second PMOS transistor TR2 conducts leakage currents between the source thereof and the drain thereof.

Thus, the output terminal BS is coupled to the reference terminal BR by means of the second PMOS transistor TR2, in particular thanks to the leakage currents of the second PMOS transistor TR2.

The first NMOS transistor TR1, the gate of which is negatively biased, does not conduct any leakage current.

During the operation of the integrated circuit CI, for example when the integrated circuit CI starts or at any instant after the integrated circuit CI starts, the device DIS detects a possible thinning of the substrate via the rear face thereof.

During the detection method, the non-inverting buffer TNI can, for example, be initially placed in the second configuration, and the device DIS then verifies that the output signal SS at the output terminal BS has not been forced to a logic state indicating a non-thinning of the substrate S, for example a high state, then move into the first configuration, and the device DIS verifies that the substrate S has not been thinned via the rear face Fr thereof.

However, it would be entirely possible for the non-inverting buffer to be initially in the first configuration, then move into the second configuration if no thinning has been detected, in order to verify that the detection of the non-thinning has not been falsified.

Hereafter, an operation of the device initially in the second configuration of the non-inverting buffer, and which then passes into the first configuration of the non-inverting buffer, will be described.

When the control circuit CTRL deliver the input signal SE in the low state thereof to the input terminal BE, the non-inverting buffer TNI is in the second configuration.

Thus, the gate-to-source voltage of the first NMOS transistor TR1 is negative and the first transistor TR1 does not conduct any leakage current, and the gate-to-source voltage of the second PMOS transistor TR2 is zero and the second PMOS transistor TR2 conducts leakage currents. The output terminal BS is therefore connected to the reference terminal BR, and therefore delivers the output signal SS being equal to the reference voltage, in this case the output signal having a low state.

Upon receiving the output signal SS in a low state, the control circuit CTRL moves the non-inverting buffer into the second configuration thereof.

If the output signal SS is in a high state, this means that an attacker has forced the output signal SS to the high state thereof in order to falsify the detection of a thinning of the substrate carried out by the device DIS having the first configuration of the non-inverting buffer, such that a thinning is not detected.

Thus, in the second configuration, if the output signal is in a high state, i.e. in this case not equal to the reference voltage, the control circuit CTRL delivers a second control signal C2 and the integrated circuit CI is deactivated or resets.

When the non-inverting buffer TNI is in the first configuration thereof, the control circuit CTRL delivers the signal SE in the high state thereof to the input terminal BE.

The gate-to-source voltage of the first NMOS transistor TR1 is therefore zero, and the first NMOS transistor TR1 therefore conducts leakage currents, and the gate-to-source voltage of the second PMOS transistor TR2 is positive, and the second PMOS transistor TR2 does not conduct any leakage current. The output terminal BS is therefore connected to the supply terminal BV, and therefore delivers the output signal equal to the supply voltage Vdd, therefore having a high state.

Upon receiving the output signal SS in the high state thereof, the control circuit CTRL moves the non-inverting buffer TNI into the third configuration by no longer delivering the input signal SE, and no longer reading the output signal SS.

Figure 4:
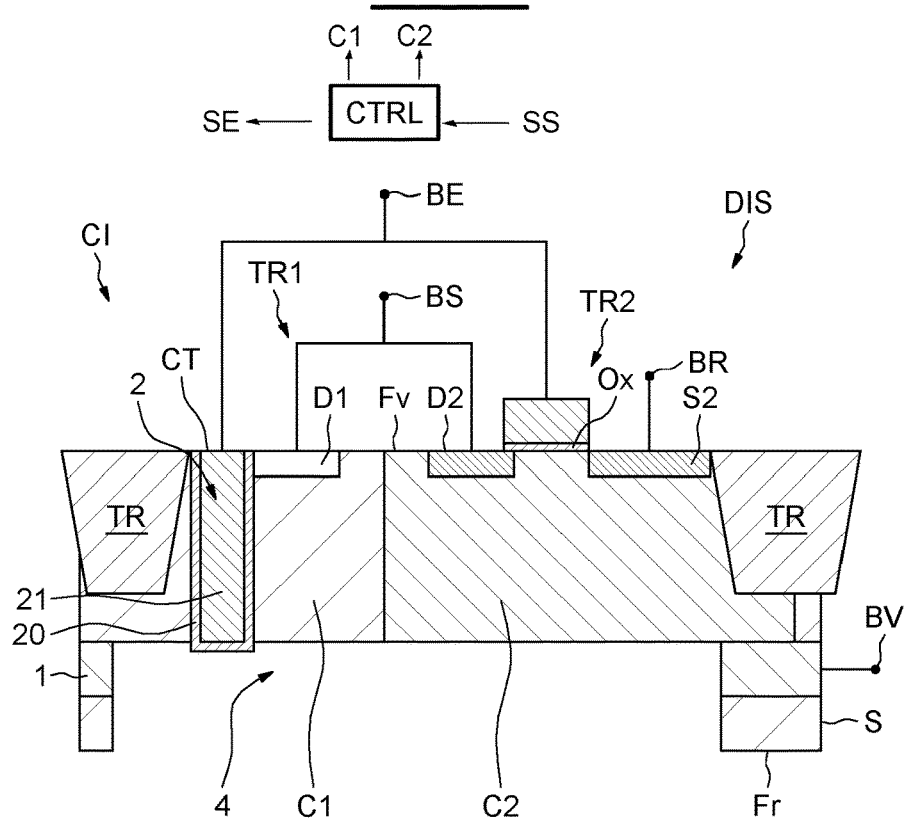
FIG. 4 illustrates thinning of the substrate.

If, as illustrated in FIG. 4, the substrate S of the integrated circuit CI has been thinned via the rear face Fr thereof, usually beyond the buried semiconductor layer 1, then the coupling between the supply terminal BV and drain D1 of the first transistor TR1 is broken, and there is therefore no longer a connection between the output terminal BS and the supply terminal BV.

Indicatively, the cavity 4 resulting from the thinning extends over a surface of twenty-five micrometers squared, namely a surface greater than the surface of part of the semiconductor layer 3 located under the device DIS, which in this case is approximately nine micrometers squared.

The output signal SS is therefore no longer in the high state thereof, and the control circuit CTRL then deliver the first control signal C1 and the integrated circuit CI is deactivated or resets.

It is therefore possible to reliably detect a possible thinning of the substrate, by verifying in the first and in the second configuration that the output signal SS is indeed in the same state as the input signal SE, i.e. by verifying the correct operation of the non-inverting buffer TNI.

FIG. 5 illustrates an embodiment in which the second MOS transistor TR2 is a vertical transistor.

In this embodiment, the second well C2 includes a second insulated vertical electrode 3, produced in the second semiconductor well C2 such as to extend from the front face Fv of the substrate S as far as a substrate S region 10 located beyond the buried semiconductor layer 1.

The second insulated vertical electrode 3 comprises a trench including an insulating wall 30, for example in this case silicon dioxide, and filled with a conductive material 31, for example in this case polysilicon.

The second insulated vertical electrode 3 includes a second electrode contact region CT2, coupled to the input terminal BE.

The second insulated vertical electrode 3 in this case includes the gate of the second transistor TR2.

An electrode semiconductor first region of the second transistor TR2, in this case the drain D2, is produced at the front face Fv of the substrate S, and includes a portion of the second well C2, which portion is doped with the second conductivity type.

The drain D2 of the second transistor TR2 is in this case coupled to the output terminal BS.

The substrate S region 10 located under the buried semiconductor layer 1 is in this case coupled to the reference terminal BR, and forms an electrode semiconductor second region of the second transistor TR2, in this case the source S2.

In this embodiment, the control circuit CTRL operates in the same manner as in the embodiment described above in relation to FIGS. 1-4.

However, it should be noted that, as illustrated in FIG. 6, when the substrate S is thinned via the rear face Fr thereof, then the coupling of the drain D1 of the first transistor TR1 to the supply terminal BV is broken, but also the coupling of the source S2 of the second transistor TR2 to the reference terminal BR.

It would furthermore be possible that a thinning of the substrate is not sufficiently deep to break the connection between the drain D1 of the first transistor TR1 and the supply terminal BV, but only the connection between the source S2 of the second transistor TR2 and the reference terminal.

In this case, the control circuit CTRL would generate the second control signal C2, even if the output signal SS has not been forced to a high state.

Indeed, in this case, when the non-inverting buffer TNI is in the second configuration thereof, the output terminal BS is floating and the control circuit CTRL reset or switch off the integrated circuit CI, then the control circuit CTRL do not read the output signal SS in a low state, i.e. equal to the reference voltage.

It is known to a person skilled in the art that the gate width of a vertical transistor is shorter than that of a horizontal transistor. Thus, the use of two vertical transistors advantageously makes it possible to reduce the surface of the device DIS.

Figure 7:
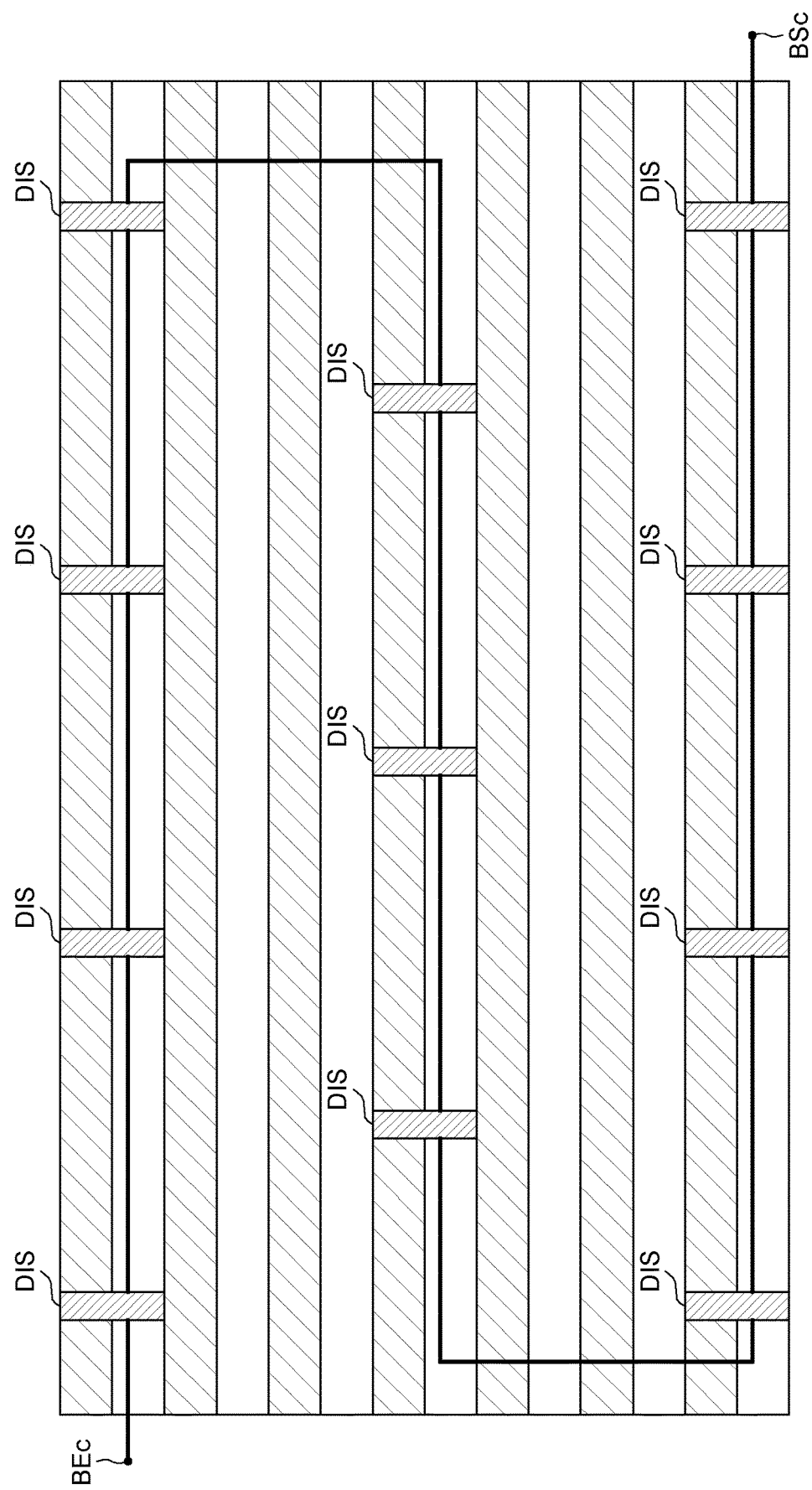
FIG. 7 illustrates an integrated circuit including devices distributed in a balanced manner.

FIG. 7 illustrates an integrated circuit CI including a plurality of devices DIS, distributed in a balanced manner over the entire surface of the integrated circuit CI.

In this embodiment, the devices DIS are coupled in series between a common input terminal BEc and a common output terminal BSc. The integrated circuit CI is thus reliably protected against the thinning of the substrate thereof over the entire surface thereof.

Figure 8:
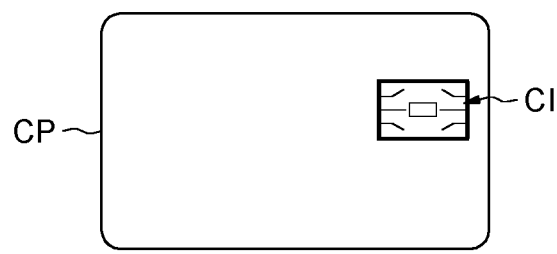
FIG. 8 shows the integrated circuit incorporated into a product.

An integrated circuit CI as described above in relation to FIGS. 1-7 can be incorporated into any type of object, particularly a chip card CP, as schematically illustrated in FIG. 8.

The invention claimed is:

1. A method for detecting a possible thinning of a semiconductor substrate of an integrated circuit via a rear face thereof, the integrated circuit being produced above a buried semiconductor layer and including a supply terminal configured to receive a supply voltage and a reference terminal configured to receive a reference voltage, wherein the integrated circuit includes a non-inverting buffer, having an input terminal and an output terminal, that is formed by a first MOS transistor and a second MOS transistor which are complementary and coupled in series between the supply terminal and the reference terminal, wherein the buried semiconductor layer includes the supply terminal, the method comprising:
applying an input signal in a first state to the input terminal of the non-inverting buffer;
moving the non-inverting buffer, in the presence of the input signal in the first state and in the absence of thinning of the substrate, into a first configuration in which the first transistor is configured to deliver a signal at the output terminal in the first state and in which the second transistor is switched off; and
generating a first control signal indicating a thinning of the substrate has occurred if the signal delivered by the output terminal is in a different state than the first state.

2. The method according to claim 1, further comprising:
applying the input signal in a second state to the input terminal of the non-inverting buffer;
moving the non-inverting buffer, in the presence of the input signal in the second state and in the absence of thinning of the substrate, into a second configuration in which the first transistor is configured to deliver a signal in the second state on the output terminal; and
generating a second control signal indicating a thinning of the substrate has occurred if the signal delivered by the output terminal is in the first state.

3. An integrated circuit, comprising:
a semiconductor substrate produced above a buried semiconductor layer and including a supply terminal configured to receive a supply voltage and a reference terminal configured to receive a reference voltage;
the semiconductor substrate supporting at least one device configured to detect a possible thinning of the semiconductor substrate via the rear face thereof, said at least one device comprising:
a non-inverting buffer including a first MOS transistor and a second MOS transistor that are complementary and coupled in series between the supply terminal and the reference terminal, an input terminal and an output terminal that is an electrode common to both the first and second MOS transistors, the buried semiconductor layer including the supply terminal;
a control circuit configured to generate an input signal in a first state;
wherein the non-inverting buffer operates, in the presence of the input signal in the first state and in the absence of thinning of the substrate, in a first configuration in which the first transistor is configured to deliver a signal having the first state on the output terminal and in which the second transistor is switched off; and
wherein the control circuit is configured to generate a control signal indicating that thinning of the substrate has occurred if the signal on the output terminal is in a different state than the first state.

4. The integrated circuit according to claim 3:
wherein the control circuit is further configured to generate the input signal in a second state; and
wherein the non-inverting buffer operates, in the presence of the input signal in the second state and in the absence of thinning of the substrate, in a second configuration in which the first transistor is configured to deliver at the output terminal a signal having the second state; and wherein the control circuit further generates a second control signal indicating that thinning of the substrate has occurred if the signal delivered by the output terminal is in the first state.

5. The integrated circuit according to claim 4,
wherein the first MOS transistor is a vertical transistor that includes:
an electrode semiconductor first region located at a front face of the semiconductor substrate and coupled to the output terminal;
an insulated vertical gate region extending between the electrode semiconductor first region and the buried semiconductor layer including an electrode semiconductor second region; and
wherein the second MOS transistor is coupled between the output terminal and the reference terminal;
the control circuit being configured to switch off the first MOS transistor and to couple the output terminal to the reference terminal via the second transistor in the second configuration, and to couple the output terminal to the supply terminal via the first MOS transistor and to switch off the second MOS transistor in the first configuration.

6. The integrated circuit according to claim 5, wherein the second MOS transistor is a horizontal transistor, an electrode semiconductor first region and an electrode semiconductor second region of which are produced at the front face of the semiconductor substrate.

7. The integrated circuit according to claim 5, wherein the semiconductor substrate is coupled to the reference terminal, the second MOS transistor being a vertical transistor, the gate of the second MOS transistor including a second insulated vertical electrode extending from the front face of the semiconductor substrate into the second semiconductor well such as to pass through the buried semiconductor layer, the semiconductor substrate including an electrode semiconductor region of the second MOS transistor.

8. The circuit according to claim 5, wherein the semiconductor substrate includes a first semiconductor well of a first conductivity type and a second semiconductor well of a second conductivity type, said first MOS transistor being of the second conductivity type and produced in the first semiconductor well, said second MOS transistor being of the first conductivity type and produced in the second semiconductor well.

9. The integrated circuit according to claim 8, wherein the second MOS transistor is a horizontal transistor, an electrode semiconductor first region and an electrode semiconductor second region of which are produced at the front face of the semiconductor substrate.

10. The integrated circuit according to claim 8, wherein the semiconductor substrate is coupled to the reference terminal, the second MOS transistor being a vertical transistor, the gate of the second MOS transistor including a second insulated vertical electrode extending from the front face of the semiconductor substrate into the second semiconductor well such as to pass through the buried semiconductor layer, the semiconductor substrate including an electrode semiconductor region of the second MOS transistor.

11. The integrated circuit according to claim 3, wherein said at least one device comprises a plurality of devices which are coupled in series between an input terminal common to all devices of the plurality of devices and an output terminal common to all devices of the plurality of devices.

12. The integrated circuit according to claim 3, which is incorporated into a system.

13. The integrated circuit according to claim 12, wherein the system is a chip card.

\* \* \* \* \*